US010431271B2

(12) United States Patent
Ma

(10) Patent No.: US 10,431,271 B2
(45) Date of Patent: *Oct. 1, 2019

(54) APPARATUSES AND METHODS FOR PROVIDING AN INDICATOR OF OPERATIONAL READINESS OF VARIOUS CIRCUITS OF A SEMICONDUCTOR DEVICE FOLLOWING POWER UP

(71) Applicant: MICRON TECHNOLOGY, INC., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/133,549

(22) Filed: Sep. 17, 2018

(65) Prior Publication Data
US 2019/0019543 A1    Jan. 17, 2019

Related U.S. Application Data

(63) Continuation of application No. 15/449,643, filed on Mar. 3, 2017, now Pat. No. 10,079,050.

(51) Int. Cl.
| G11C 5/14 | (2006.01) |
| G11C 7/22 | (2006.01) |
| H03K 19/00 | (2006.01) |
| G11C 7/10 | (2006.01) |
| G11C 7/06 | (2006.01) |
| G11C 7/20 | (2006.01) |
| H03K 17/22 | (2006.01) |

(52) U.S. Cl.
CPC ............... *G11C 7/22* (2013.01); *G11C 5/148* (2013.01); *G11C 7/065* (2013.01); *G11C 7/10* (2013.01); *G11C 7/20* (2013.01); *H03K 19/0005* (2013.01); *G11C 5/14* (2013.01); *H03K 17/223* (2013.01)

(58) Field of Classification Search
CPC ......... G11C 5/148; G11C 5/14; H03K 17/223
USPC .......................................... 365/226; 327/143
See application file for complete search history.

(56) References Cited

U.S. PATENT DOCUMENTS

| 5,519,347 A | 5/1996 | Kim |
| 5,557,579 A | 9/1996 | Raad et al. |
| 6,005,423 A | 12/1999 | Schultz |
| 6,362,669 B1 | 3/2002 | Zhou et al. |
| 6,937,074 B2 | 8/2005 | Shin |
| 7,091,758 B2 | 8/2006 | Chun et al. |
| 7,212,046 B2 | 5/2007 | Hur |
| 7,436,226 B2 * | 10/2008 | Kim ..................... H03K 17/223 327/142 |
| 8,035,427 B2 | 10/2011 | Kim |
| 8,649,237 B2 | 2/2014 | Choi |

(Continued)

Primary Examiner — Son L Mai
(74) Attorney, Agent, or Firm — Dorsey & Whitney LLP

(57) ABSTRACT

Apparatuses and methods for providing an indicator of operational readiness of various circuits of a semiconductor device following power up are described in the present disclosure. An example apparatus includes a first circuit configured to receive a supply voltage and further configured to provide an active first signal responsive to the supply voltage exceeding a threshold voltage. The example apparatus further includes a second circuit coupled to the first circuit and activated by the active first signal, the second circuit configured to provide an active second signal when a third circuit is ready for operation.

19 Claims, 8 Drawing Sheets

(56) References Cited

U.S. PATENT DOCUMENTS

| | | | |
|---|---|---|---|
| 10,079,050 B1 * | 9/2018 | Ma | G11C 7/20 |
| 2004/0012267 A1 | 1/2004 | Kang | |
| 2018/0254075 A1 | 9/2018 | Ma | |

* cited by examiner

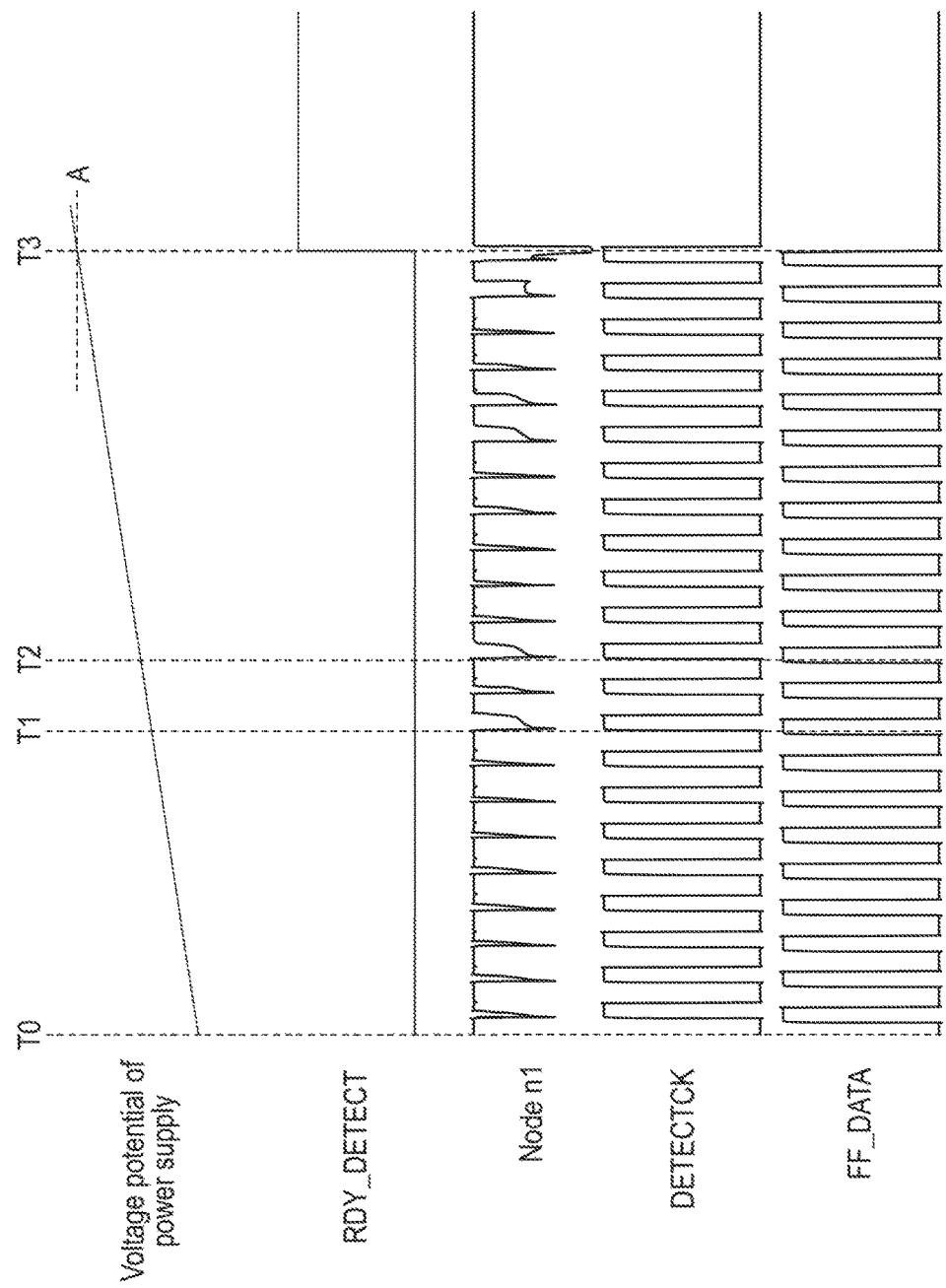

APPARATUSES AND METHODS FOR PROVIDING AN INDICATOR OF OPERATIONAL READINESS OF VARIOUS CIRCUITS OF A SEMICONDUCTOR DEVICE FOLLOWING POWER UP

CROSS-REFERENCE TO RELATED APPLICATION(S)

This application is a continuation of U.S. application Ser. No. 15/449,643 filed Mar. 3, 2017 and issued as U.S. Pat. No. 10,079,050 on Sep. 18, 2018. The aforementioned application, and issued patent, are incorporated herein by reference, in its entirety, for any purpose.

BACKGROUND

Semiconductor devices such as microcomputers, memories, gate arrays, among others, rely on power to operate. One or more power supplies are used to provide power to the semiconductor device. When power is initially provided to a semiconductor device, for example, at power up or system reset, a supply voltage provided by the power supply ramps up from a zero voltage to a nominal supply voltage. Operation of the circuits of the semiconductor device should be suppressed until the power provided by the power supply is sufficient for the circuits to operate correctly. Operation of circuits prior to when sufficient power is provided may result in the circuits failing to operate correctly.

Voltage detections circuits may be included in a semiconductor device to determine when the supply voltage reaches a minimum voltage assumed to be sufficient for the circuits to operate correctly. However, relying simply on the voltage of the supply voltage to determine sufficiency of power may nonetheless not be an adequate measure.

BRIEF DESCRIPTION OF THE DRAWINGS

FIG. 7 is a timing diagram of various signals during operation of the model circuit of FIG. 6 according to an embodiment of the disclosure.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
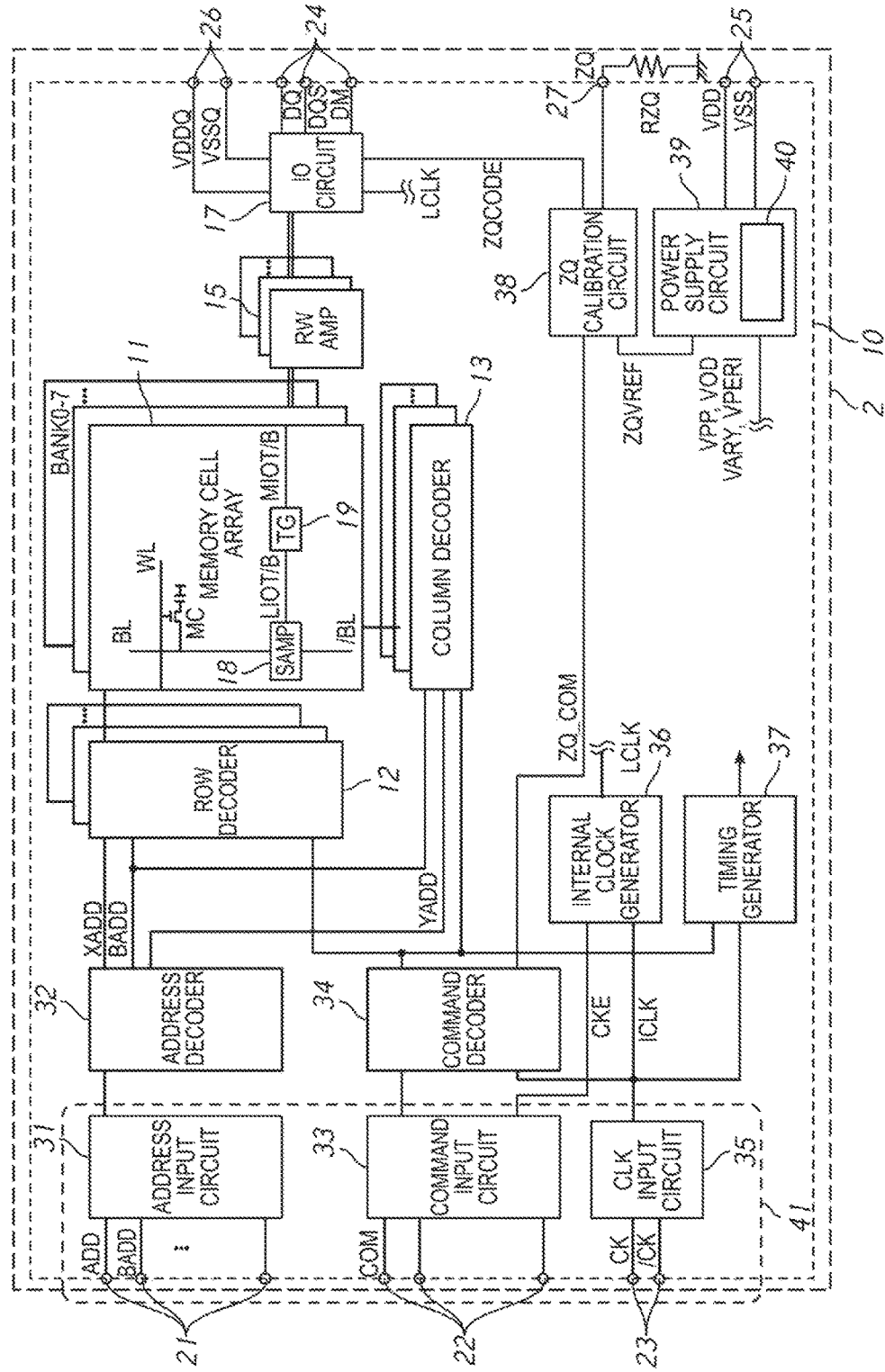
FIG. 1 is a block diagram of a semiconductor device in accordance with an embodiment of the disclosure.

FIG. 1 is a block diagram of a semiconductor device in accordance with an embodiment of the present disclosure. The semiconductor device 10 may be a memory device integrated into a single semiconductor chip, for example. The semiconductor device 10 may be mounted on an external substrate 2 that is a memory module substrate, a mother board or the like. The semiconductor device 10 may include various circuits, including memory circuits, as will be described in more detail below. As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23. A data interface block 42 includes the data terminals 24. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit to an address decoder 32. The address decoder 32 recedes the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQ_COM provided to the ZQ calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input output circuit 17 may include input buffers, according to one embodiment.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply voltages VDD and VSS. These power supply voltages VDD and VSS are supplied to an internal power supply circuit 39. The internal power supply circuit 39 generates various internal voltages VPP, VOD, VARY, VPERI, and the like and a reference voltage ZQVREF based on the power supply voltages VDD and VSS. The internal voltage VPP is mainly used in the row decoder 12, the internal voltages VOD and VARY are mainly used in the sense amplifiers 18 included in the memory cell array 11 and the internal voltage VPERI is used in many other circuit blocks. The reference voltage ZQVREF is used in the ZQ calibration circuit 38.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD and VSS that are supplied to the power supply terminals 25, respectively. However, the dedicated power supply voltages VDDQ and VSSQ may be used for the input output circuit 17 so that power supply noise generated by the input/output circuit 17 does not propagate to the other circuit blocks.

The internal power supply circuit 39 includes a power up control circuit 40. The power up control circuit 40 is configured to provide a signal that may be used to indicate when various circuits of the semiconductor device 10 are ready for operation following power up. During power up, power is provided to the semiconductor device. The supply voltage ramps up until reaching an operating voltage. The power up control circuit 40 prevents circuits of the semiconductor device 10 from being prematurely operated, for example, while the power provided by the power supply is inadequate for proper operation. The signal provided by the power up control circuit 40 may be used to indicate when circuits or a subset of circuits of the semiconductor device 10 may operate properly, for example, for performing initialization operations, for normal device operation, etc.

The calibration terminal ZQ is connected to the calibration circuit 38. The calibration circuit 38 performs a calibration operation with reference to an impedance of an external resistor RZQ and the reference voltage ZQVREF, when activated by the calibration signal ZQ_COM. The external resistor RZQ that is connected to a calibration terminal ZQ 27 of the semiconductor device 10. The external resistor RZQ is a reference impedance of a ZQ calibration circuit 38. In the present embodiment the external resistor RZQ is coupled to ground. An impedance code ZQCODE obtained by the calibration operation is supplied to the input/output circuit 17, and thus an impedance of an output buffer (not shown) included in the input/output circuit 17 is specified.

Figure 2A:
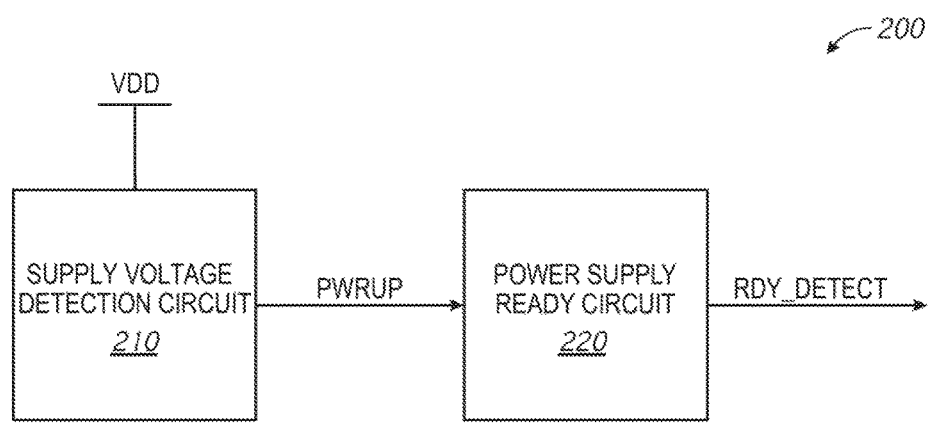
FIG. 2A is a block diagram of a power up control circuit according to an embodiment of the disclosure.

FIG. 2A is a block diagram of a power up control circuit 200 according to an embodiment of the disclosure. The power up control circuit 200 may be used to prevent circuits of a semiconductor device from being prematurely operated when the power supplied is inadequate for proper operation. At power up (e.g., startup) the power up control circuit 200 may suppress operation of various circuits of the semiconductor device until ready for operation following power up.

The power up control circuit 200 includes a supply voltage detection circuit 210 and a power supply ready circuit is 220. The supply voltage defection circuit 210 provides a power up enable signal PWRUP that may indicate when the supply voltage has reached a voltage. For example, during power up, the supply voltage detection circuit 210 may provide an inactive PWRUP signal when the supply voltage is below a threshold voltage. When the supply voltage of the power supply has reached the threshold voltage, the supply voltage detection circuit 210 provides an active PWRUP signal (e.g., a PWRUP signal having a high logic level). The high logic level PWRUP signal may indicate that a supply voltage of the power supply has reached a threshold voltage.

The power supply ready circuit 220 is coupled to receive the PWRUP signal and provides a ready signal RDY_DETECT. The RDY_DETECT signal may be used to indicate the operational readiness of various circuits of the semiconductor device 10 following power up. As will be described in more detail below, the power supply ready circuit 220 may include a circuit or circuits that model various circuits of the semiconductor device 10. Responsive to the model circuits operating correctly following power up, an active RDY_DETECT signal is provided by the power supply ready circuit 220. The active RDY_DETECT signal may signal when the modeled circuits are similarly ready for correct operation.

Figure 2B:
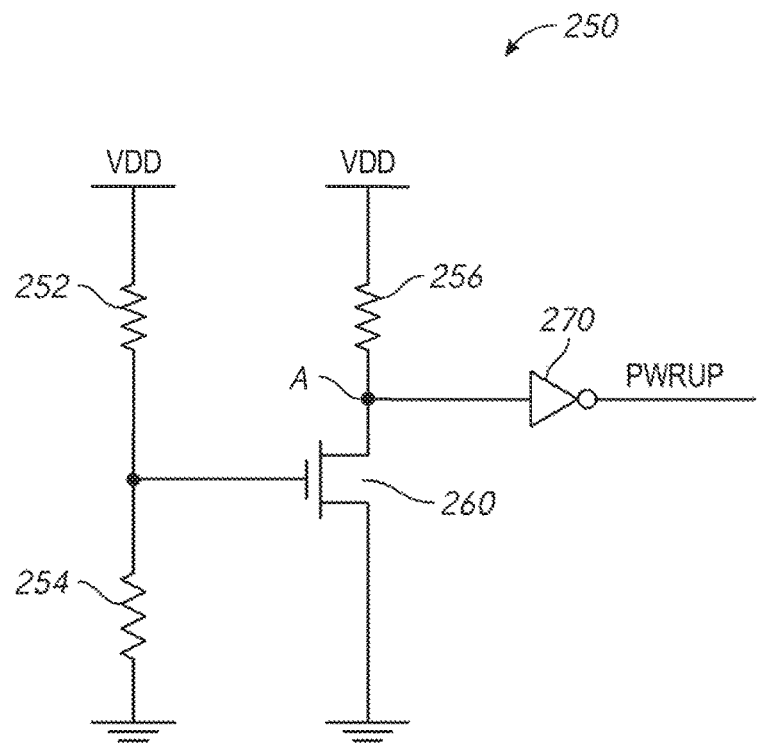
FIG. 2B is a schematic diagram of an example supply voltage detection circuit for the power up control circuit of FIG. 2A.

FIG. 2B is a schematic diagram of an example supply voltage detection circuit 250. The supply voltage detection circuit 250 includes resistances 252 and 254 coupled in series between a power supply and ground. The supply voltage detection circuit 250 further includes a resistance 256 coupled in series with a transistor 260 between the power supply and ground. An inverter circuit 270 is coupled to a node A between the resistance 256 and the transistor 260. The inverter circuit 270 provides an active power up enable signal PWRUP when the supply voltage of the power supply exceeds a threshold voltage. The point at which the supply voltage detection circuit 250 provides an active PWRUP signal may be referred to as a trip-point. During power up (i.e., the supply voltage ramps up), the trip-point occurs when the supply voltage exceeds a threshold voltage. Similarly, during power down (i.e., the supply voltage ramps down), the trip-point occurs when the supply voltage falls below the threshold voltage.

In operation, the trip-point for the supply voltage detection circuit 250 corresponds to when the transistor 200 turns ON and OFF. For example, daring power-up, the PWRUP signal changes to a high logic level when the transistor 260 turns ON. The PWRUP signal changes to a high logic level because the voltage at the chain of transistor 260 (i.e., node A) is pulled to ground when the transistor 260 is turned ON. The ground level voltage at node A is then inverted by the inverter 270 to provide a high logic level PWRUP signal.

As previously discussed, the PWRUP signal may represent when the power up sequence for the supply voltage has been completed. However, as also previously discussed, while the supply voltage detection circuit 250 may determine that the supply voltage has reached a threshold voltage, the power supply may nonetheless not provide adequate power for proper operation of some circuits, although the power supply may base a sufficient supply voltage. For example, bistable multivibrators (e.g., flip flops, latches, etc.) may not operate properly even if the supply voltage is sufficient, such as by failing to enter a stable state when a trigger pulse is provided and/or failing to correctly latch a logic level.

The reads signal RDY_DETECT provided by the power up control circuit 200 may be used enable operation of various circuits in the semiconductor device 10 in order to avoid incorrect operation. For example, whereas in convention devices the PWRUP signal is used to enable operation of the circuits, in an embodiment of the disclosure including the power up control circuit 200, the ready signal RDY_DETECT may be used instead. In this manner incorrect operation of the various circuits due to premature operation may be prevented. For example, instead of using the PWRUP signal, the RDY_DETECT signal may be used to safely initiate operation.

Figure 2C:
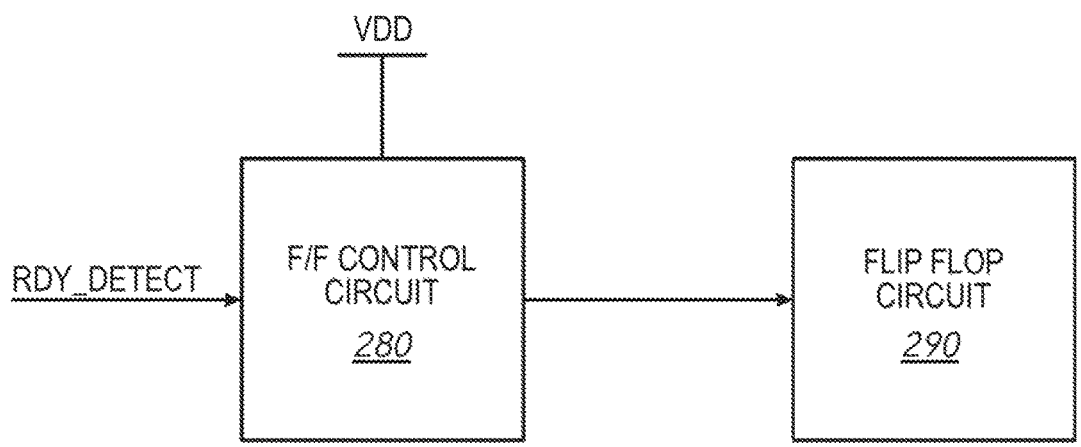
FIG. 2C is a block diagram of a flip flop control circuit and a flip flop circuit according to an embodiment of the disclosure.

FIG. 2C illustrates example circuits that may receive the RDY_DETECT signal in an embodiment of the disclosure. A flip flop control circuit 280 receives the RDY_DETECT signal from the power up control circuit 200. When the RDY_DETECT signal becomes active to indicate operational readiness the flip flop control circuit 280 provides a control signal to activate (e.g., reset/set) a flip flop circuit 290 for operation. Prior to the flip flop control circuit 280 receiving an active RDY_DETECT signal, the flip flop circuit 290 remains deactivated in order to prevent it from operating incorrectly. In this manner, the flip flop circuit 290 will not operate until conditions are sufficient for correct operation, thus preventing any errors that may result from premature operation. In an embodiment of the disclosure, the flip flop circuit 290 may be included in an input/output circuit, for example, input/output circuit 17 of FIG. 1. In such an embodiment, the flip flop circuit 290 may be used to latch data, for example, read data to be provided by the semiconductor device 10 or write data to be received by the semiconductor device 10. In an embodiment of the disclosure, the flip flop circuit 290 may be included in an address and/or command input circuit, for example, address input circuit 31 and command input circuit 33 of FIG. 1. The flip flop 290 may be used to latch address information in an address input circuit, and to latch command information in a command input circuit.

The ready signal RDY_DETECT may also be used in an embodiment of the disclosure as a reset signal. For example, the ready signal RDY_DETECT may be used to control an internal reset operation of the semiconductor device 10, which causes the reset to an initial state.

Figure 3:
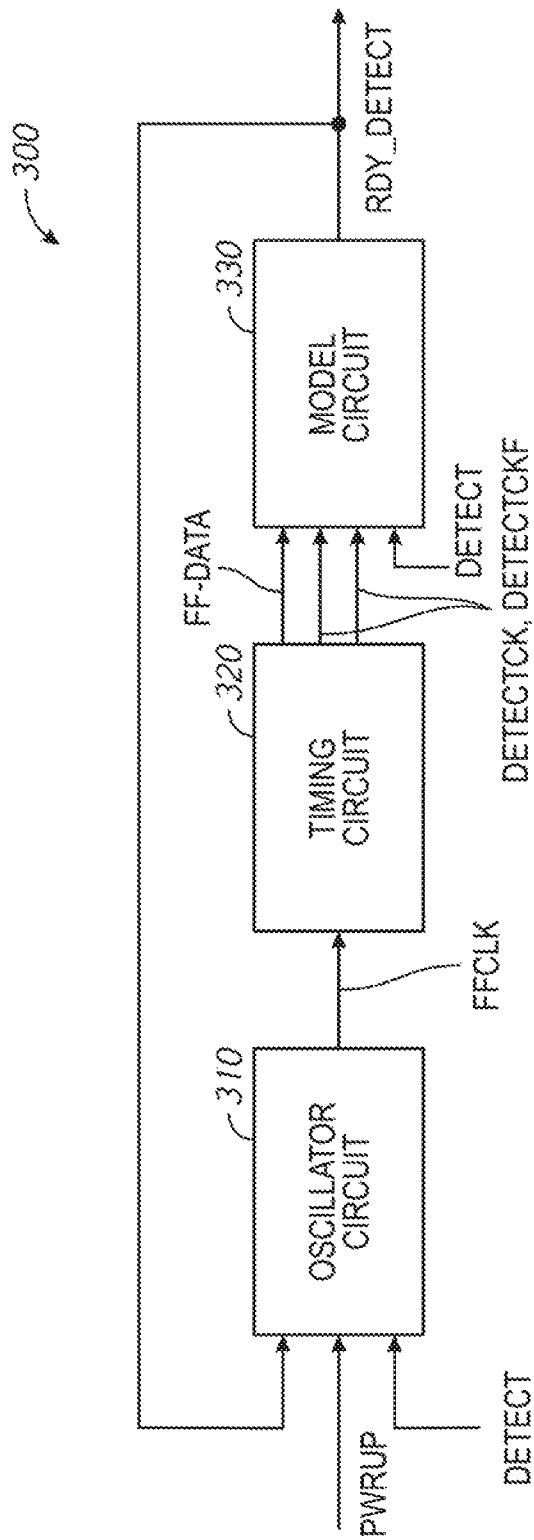
FIG. 3 is a block diagram of a power supply ready circuit according to an embodiment of the disclosure.

FIG. 3 is a block diagram of a power supply ready circuit 300 according to an embodiment of the disclosure. The power supply ready circuit 300 may be used as the power supply ready circuit 220 of FIG. 2A.

The power supply ready circuit 300 includes an oscillator circuit 310 that receives a detection enable signal DETECT and a power up enable signal PWRUP. When activated by the DETECT signal, the oscillator circuit 310 provides an oscillating output signal FFCLK. The DETECT signal may be provided by a control circuit (not shown in FIG. 3) that enables the power up control circuit 300, for example, when power up is started. The oscillator circuit 310 maybe activated in other circumstances as well, for example, following a reset of the semiconductor device 10. The PWRUP signal may be provided by the supply voltage detection circuit 210 of FIG. 2A. The oscillator circuit 310 further receives a ready signal RDY_DETECT of the power supply ready circuit 300. As will be described in more detail below, the oscillator circuit 310 may be deactivated when the RDY_DETECT signal is active, which may indicate that various circuits of the semiconductor device 10 may be operated properly.

A timing circuit 320 is coupled to an output of the oscillator circuit 310 and receives the FFCLK signal. The timing circuit 320 provides clock signals DETECTCK and DETECTCKF, and further provides an oscillating data signal FF_DATA responsive to the FFCLK signal. The DETECTCK and DETECTCKF signals are complementary. The FF_DATA signal and the DETECTCK, DETECTCKF signals may be based at least in part on the FFCLK signal. The DETECTCK and DETECTCKF signals may be delayed relative to the FF_DATA signal, as will be described in more detail below.

A model circuit 330 is coupled to the timing circuit 320 and receives the FF_DATA signal, and the DETECTCK and DETECTCKF signals. The model circuit 330 further receives the DETECT signal, and may be reset by the DETECT signal. The model circuit 330 provides the RDY_DETECT signal responsive to the FT_DATA, and DETECTCK and DETECTCKF signals. The RDY_DETECT signal has an active logic level that indicates when the model circuit is operating properly. For example, the RDY_DETECT signal may have a low logic level indicating that model circuit is not yet operating properly, and change to a high logic level (i.e., the active logic level) when the model circuit is operating properly. The RDY_DETECT signal is provided to the oscillator circuit 310. As previously described, the RDY_DETECT signal deactivates the oscillator circuit 310 when the RDY_DETECT signal is active.

The model circuit 330 may be representative of circuit of the semiconductor device 10. As such, when the model circuit 330 operates properly and provides an active RDY_DETECT signal, it may be assumed that other circuits of the semiconductor device 10 that are modeled by the model circuit 330 may now also operate properly following power up. Proper operation may occur when the power supply provides adequate power. Consequently, by using the model circuit 330 to provide the active RDY_DETECT signal when it is updating properly, the RDY_DETECT signal may be used to also indicate when the power supply is providing adequate power for proper operation of other circuits being modeled.

The model circuit 330 may model other circuits in that the model circuit 330 operates in a manner similar to the circuits being modeled. For example, the model circuit 330 operates properly under the same or similar power conditions as the circuits being modeled. In some embodiments, the model circuit is the same type of circuit being modeled. For example, the model circuit 330 may be a flip flop circuit and is intended to model other flip flop circuits of the semiconductor device 10. Thus, when the model circuit 330 operates properly (e.g., correctly latches a logic level) it may be assumed that the other flip flop circuits may operate properly as well. The model circuit may be other types of circuits as well in other embodiments, for example, latch circuits, other bistable multivibrators, etc.

In some embodiments, the performance of the model circuit 330 may be different than the performance of the circuits being modeled. For example, the model circuit 330 may have lesser performance than other flip flops of the memory device. In this manner, when the lesser performing model circuit 330 indicates it is operating properly, the active RDY_DETECT signal may provide greater assurance that the other circuits that are being modeled may operate properly.

Figure 4:
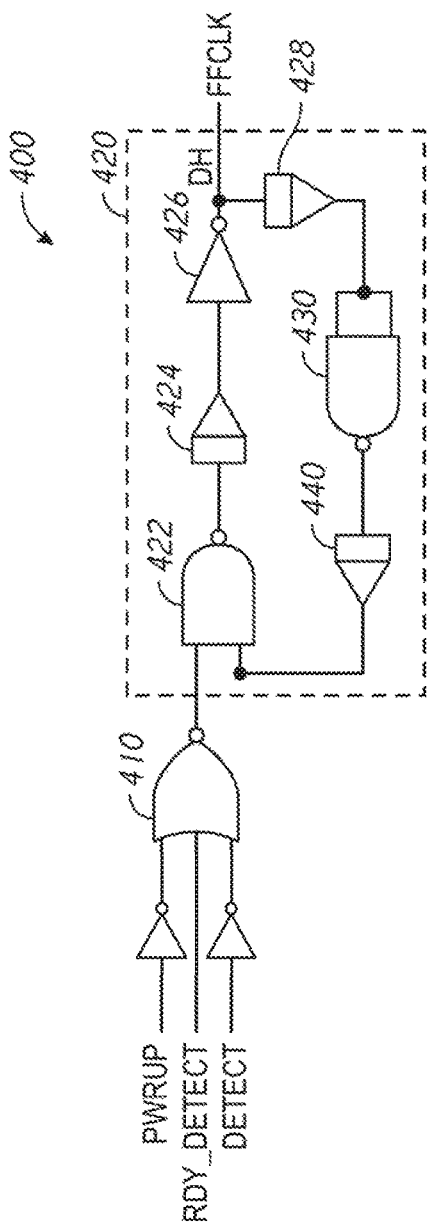
FIG. 4 is a schematic diagram of an oscillator circuit according to an embodiment of the disclosure.

FIG. 4 is a schematic diagram of an oscillator circuit 400 according to an embodiment of the disclosure. In some embodiments, the oscillator circuit 400 may be used for the oscillator circuit 310 of FIG. 3.

The oscillator circuit 400 includes an input gate 410 and a delay ring 420. The input gate 410 is illustrated in the embodiment of FIG. 4 as including a NOR logic gate. In other embodiments, the input gate 410 may include a different logic gate and/or different circuits. The input gate 410 receives the power up enable signal PWRUP and the detection enable signal DETECT. The input gate 410 further receives the ready signal RDY_DETECT. The input gate 410 provides a start signal START to the delay ring 420. The delay ring 420 includes a NAND gate 422, a delay circuit 424, an inverter 426, a delay circuit 428, an inverter 430, and a delay circuit 432, all coupled in series. An input of the NAND gate 422 receives the output signal from the input gate 410, and another input of the NAND gate 422 receives an output of the delay circuit 432. An oscillating output signal FFCLK is provided at an output of the inverter 426.

In operation, the oscillator circuit 400 is activated by an active DETECT signal. When an active PWRUP signal is provided to the input gate 410, the input gate 410 provides an active START signal to cause the delay ring 420 to provide the FFCLK signal. The active START signal causes the NAND gate 422 to operate as an inverter to the signal output by the delay circuit 432. In this configuration, the signal input to the NAND gate 422 is inverted and propagated through the delay circuit 424 before being inverted by the inverter 426, which provides the FFCLK signal. The output of the inverter 426 is further delayed by delay circuit 428 and inverted by inverter 430, and again delayed by delay circuit 432 before being provided to the NAND gate 422. Following the propagation of the signal through the ring including NAND gate 422, delay circuit 424, inverter 426, delay circuit 428, inverter 430, and delay circuit 432, the logic level of the output signal of the delay circuit 432 is complementary to the previous logic level of the signal provided to the NAND gate 422. The NAND gate 122 inverts the signal, which is then propagated through the ring again but with the inverted logic level. As a result, as signals are repeatedly propagated around the ring and inverted by the NAND gate 422, the FFCLK signal oscillates between logic high and logic low levels. The period of the oscillations of the FFCLK signal is based on the propagation delay through the NAND gate 422, the delay circuits 424, 428, and 432 and the inverters 426 and 430. When the RDY_DETECT signal changes to a high logic level, the oscillator circuit 400 is deactivated. As a result, the START signal is no longer active and the oscillator circuit 400 ceases providing an oscillating FFCLK signal.

Figure 5:
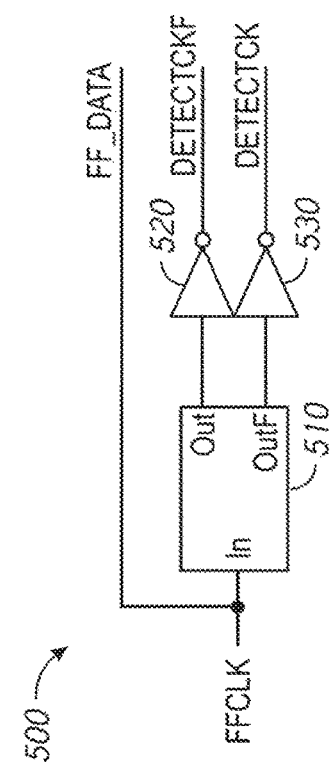
FIG. 5 is a schematic diagram of a timing circuit according to an embodiment of the disclosure.

FIG. 5 is a schematic diagram of a timing circuit 500 according to an embodiment of the disclosure. In some embodiments, the timing circuit 500 may be used for the timing circuit 320 of FIG. 3.

Figure 10A:
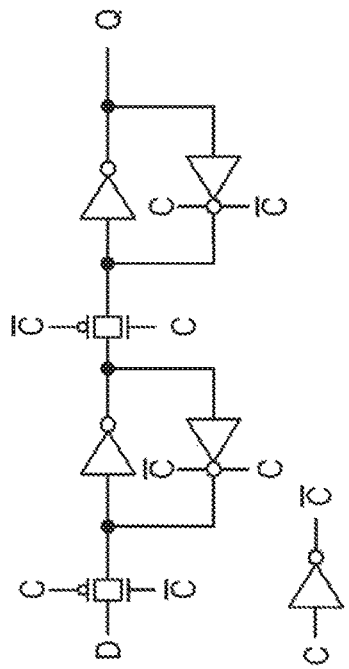
FIG. 10A is a schematic diagram of D flip flop circuit according to an embodiment of the disclosure.
Figure 10B:
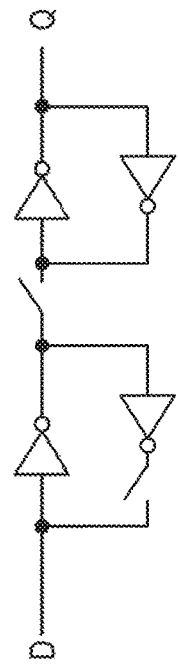
FIG. 10B is a schematic diagram of the D flip flop circuit of 10A for a first clock level.
Figure 10C:
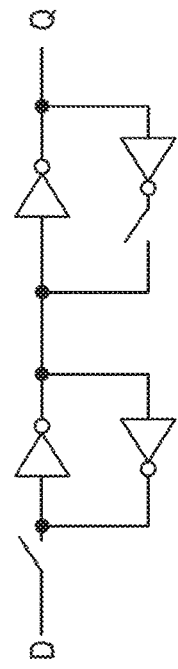
FIG. 10C is a schematic diagram of the D flip flop circuit of 10A for a second clock level.
Figure 8:
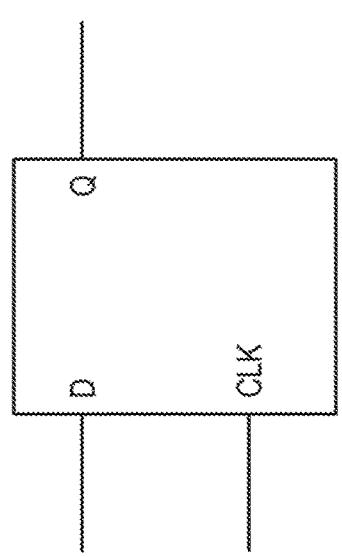
FIG. 8 is a block diagram of a D flip flop circuit.
Figure 9:
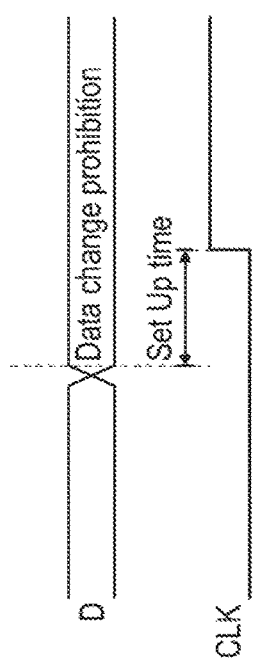
FIG. 9 is a timing diagram of various signals for the D flip flop circuit of FIG. 8.

The timing circuit 500 includes a phase splitter circuit 510 and inverter circuits 520 and 530. The phase splitter circuit 510 receives the FFCLK signal and provides complementary signals having the same frequency of oscillation. The two signals are provided to respective inverters 520 and 530, which invert the signals before being provided as the complementary clock signals DETECTCK and DETECTCKF. The timing circuit 500 is configured to provide the FFCLK signal as the FF_DATA signal. A propagation delay of the phase splitter 510 and the delay of the inverters 520 and 530 may cause the DETECTCK and DETECTCKF signals to have a delay relative to the FFCLK signal. In some embodiments, the inverters 520 and 530 may also be configured to provide additional delay relative to the FFCLK signal when providing the DETECTCK and DETECTCKF signals. The time difference between the FF_DATA signal and the DETECTCK and DETECTCKF signals may be a set up time for a D latch circuit for example. For example, as shown in FIG. 8, a D-flip flop (D-F/F) circuit includes a data input terminal D receiving a data signal, a clock input terminal CLK receiving a clock signal and a data output terminal Q. For example, the D-F/F circuit may be constituted by a circuit as shown in FIG. 10A. In order to correctly latch data at D-F/F circuit, data at the data input terminal D should be inputted by a minimum period before changing an edge of the clock, for example, from a low logic level to a high logic level. The data should not change during the minimum period. The minimum period is the set up time as shown in FIG. 9. The timing circuit 500 may be provided to produce the set up time. Therefore, the propagation delay of the phase splitter 510 and the delay of the inverters 520 and 530 may be adjusted to provide the set up time. In more detail, as shown in FIG. 10B, when the clock CLK is the low logic level, the front stage of the D-F/F circuit inputs the data signal D and the last stage holds the previous data signal D. As shown in FIG. 10C, when the clock CLK changes to the high logic level, the front stage holds the inputted data signal D and the held data signal D is transferred to the last stage. At this time, if the input data signal D is not latched at the front stage, that is, the input data signal D is not correctly held, the signal may be an intermediate voltage potential (metastable status) between the low and high logic levels. Therefore, the set up time is needed to correctly latch or hold the input data.

Figure 6:
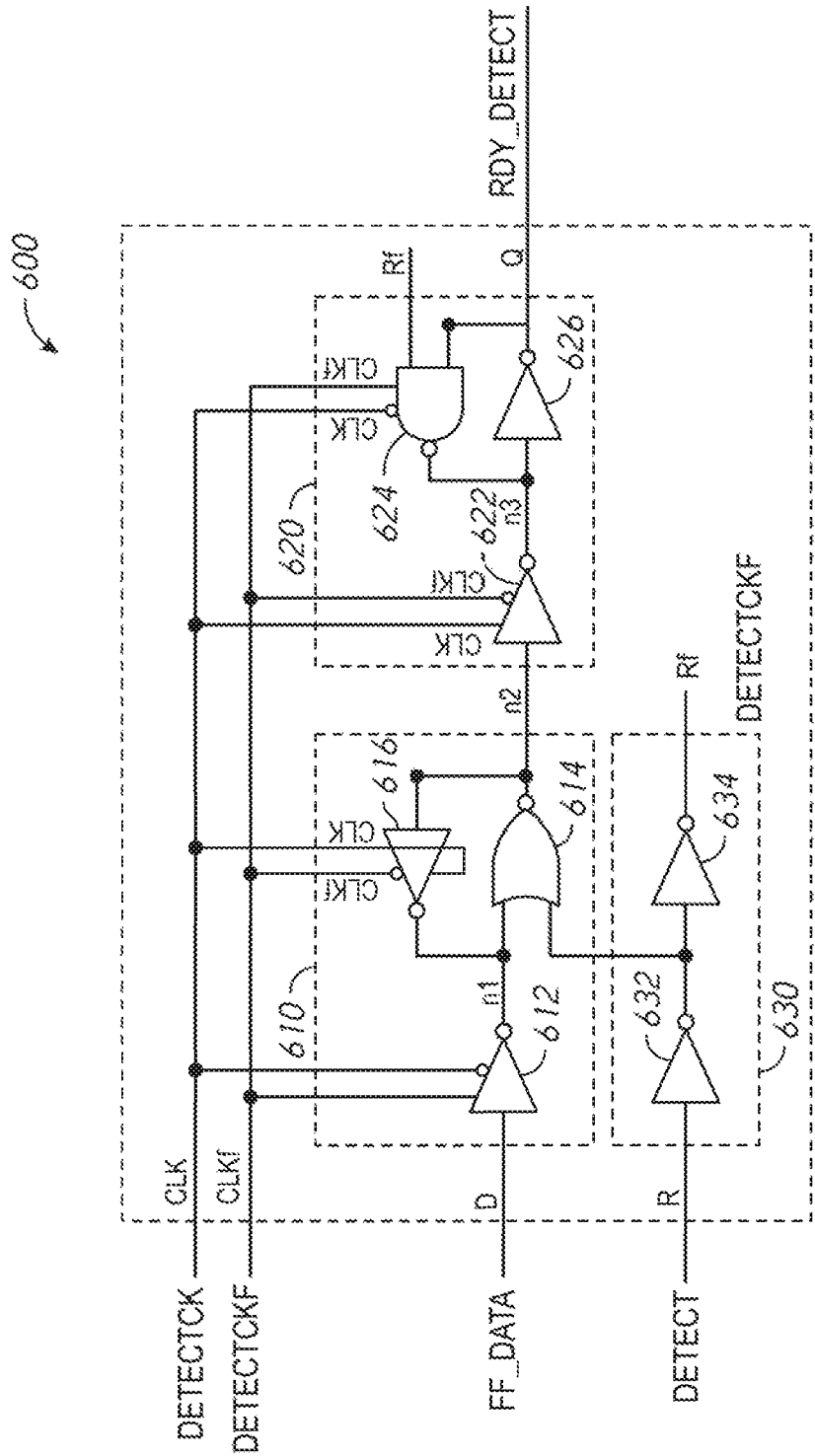
FIG. 6 is a schematic diagram of a model circuit according to an embodiment of the disclosure.

FIG. 6 is a schematic diagram of a model circuit 600 according to an embodiment of the disclosure. In some embodiments, the model circuit 600 may be used for the model circuit 330 of FIG. 3. The model circuit 600 is configured as a flip flop circuit in the embodiment of FIG. 6, and will be referred as the flip flop circuit 600.

The flip flop circuit 600 includes a latch circuit 610 a latch circuit 620, and a reset circuit 630. When activated by the detection enable signal DETECT, the latch circuits 610 and 620 are clocked by the complementary clock signals DETECTCK and DETECTCKF to latch a logic level of a signal received at an input D of the flip flop circuit 600 and propagate the logic level to an output Q of the flip flop circuit 600 to provide the ready signal RDY_DETECT. The DETECTCK and DETECTCKF signals are received at clock inputs CLK and CLKf.

The latch circuit 610 includes an inverter 612, and further includes NOR gate 614 and inverter 616. The inverters 612 and 614 are activated to insert an input signal and provide an output signal by the DETECTCK and DETECTCKF signals. The latch circuit 620 includes an inverter 622, and further includes NAND gate 624 and inverter 626. The inverter 612 and NAND gate 624 are activated (and the inverters 616 and 622 are deactivated) concurrently, and the inverters 616 and 622 are activated (and the inverter 612 and NAND gate 624 are deactivated) concurrently. In an embodiment of the disclosure, the NAND gate 624 may enter a high impedance state when not activated.

The reset circuit 630 includes investors 632 and 634 coupled in series. The inverter 632 receives the DETECT signal and provides an output signal to the NOR gate 614 and to the inverter 634. The inverter 634 provides an output signal Rf to the NAND gate 624. The reset circuit 630 causes the latch circuit 610 and the latch circuit 620 to reset and hold the logic levels of the respective output signals. The flip flop circuit 600 is deactivated and is reset by an inactive DETECT signal to provide a low logic level RDY_DETECT signal.

In operation, the flip flop circuit 600 is activated by an active DETECT signal to latch and propagate an input signal received at the input D to provide the RDY_DETECT signal at the output Q. Prior to being activated, the inactive DETECT signal causes the reset circuit 630 to set node n1 to have a high logic level, node n2 to have a low logic level, node n3 to have a high logic level, and the RDY_DETECT signal to have a low logic level. The FF_DATA signal will also have a low logic level as provided by an oscillation circuit (e.g., oscillation circuit 310) prior to the DETECT signal becoming active.

Following activation by the DETECT signal, the nodes n1, n2, and n3, and the RDY_DETECT signal remain at the same logic levels as prior to activation until the FF_DATA signal switches to a high logic level and the latches 610 and 620 correctly latch the high logic level of the FF_DATA signal responsive to the DETECTCK and DETECTCKF signals. The high logic level FF_DATA signal is inverted by the inverter 612 when activated by a low logic level DETECTCK signal (and a high logic level DETECTCKF signal) to cause the it node n1 to change to a low logic level. The NOR gate 614, which is enabled to behave as an inverter due to the active DETECT signal, causes the node n2 to change to a high logic level. The inverter 622 is deactivated by the low logic level DETECTCK signal so that the logic level of the node n3 does not change. The inverter 616 is also deactivated by the low logic level DETECTCK signal.

When the DETECTCK signal switches to a high logic level, the inverter 612 is deactivated, while the inverters 616 and 622 are activated. The logic level of the node n1 is latched by the NOR gate 614 and the inverter 616 when the inverter 616 is activated. The activated inverter 622 inverts the high logic level at node n2 to cause the node n3 to change to a low logic level. The inverter 626 in turn inverts the low logic level of node n3 to provide a high logic level RDY_DETECT signal. The logic level of the node n3 is latched by the inverter 626 and the NAND gate 624, which is enabled to behave as an inverter due to active DETECT signal, when the DETECTCK signal switches to a low logic level.

As the logic level of the FF_DATA signal changes, the activation and deactivation of the inverters 612, 616, and 622, and of the NAND gate 624 by the DETECTCK signal (and DETECTCKF signal) capture changes of the logic level at the input D and propagate the logic level through to the output Q for the RDY_DETECT signal.

The flip flop circuit 600 maybe be used during power up to provide a RDY_DETECT signal indicating when the flip flop circuit 600 operates properly. That is, after activation by an active DETECT signal, the RDY_DETECT signal may switch from a low logic level to a high logic level when the Hip flop circuit 600 is properly operating, for example, the flip flop circuit 600 correctly latches the logic level of the FF_DATA signal. As previously described, the high logic level RDY_DETECT signal may be used to indicate that other flip flop circuits may be ready for operation as well.

Operation of the flip flop circuit 600 to provide an RDY_DETECT signal to indicate operational readiness of the flip flop will be described with reference to FIG. 7. FIG. 7 is a timing diagram of various signals during operation of the flip flop circuit 600 according to an embodiment of the disclosure.

Prior to time T0 the flip flop circuit 600 is deactivated and reset by an inactive DETECT signal to provide a low logic level RDY_DETECT signal. The node n1 is at a high logic level, the node n2 is at a low logic level, and the node n3 is at a high logic level, as previously described for a deactivated state. As a result, the RDY_DEFECT signal is at a low logic level. Still prior to time T0, but after the PWRUP signal becomes active, indicating that the supply voltage has exceeded a threshold voltage, an oscillator circuit provides an oscillating FFCLK signal (e.g., oscillating circuit 310, oscillator circuit 400). The oscillating FFCLK signal is received by a tuning circuit, which provides the DETECTCK and DETECTCKF signals and the FF_DATA signal to the flip flop circuit 600. As previously described, the DETECTCK and DETECTCKF are complementary clock signals, and the FF_DATA signal is an oscillating signal based on the oscillating FFCLK signal. The DETECTCK clock signal and the FF_DATA signal are shown in FIG. 7.

As illustrated in FIG. 7, although the FF_DATA signal is oscillating, and the DETECTCK and DETECTCKF signals are clocking between high and low logic levels, the latch circuit 610 is unable to latch a logic level of the FF_DATA signal, as shown by the voltage at the node n1. When operating properly, the latch circuit 610 should latch a low logic level at the node n1 when FF_DATA signal is a high logic level and the DETECTCK signal is at a high logic level (and the DETECTCK signal is at a low logic level). The failure of the latch circuit 610 to successfully latch the logic level at the node n1 is reflected in FIG. 7 by the voltage at the node n1 generally remaining at the high logic level with low going voltage transients corresponding to the rising edges of the FF_DATA signal and rising edges of the DETECTCK signal. For example, during the time period between times T0 and T3, the voltage level of the node n1 is unable to be latched at a low logic level by the latch circuit 610. The low going voltage transients corresponding to the rising edges of the FF_DATA and DETECTCK signals (e.g., at times T1 and T2) reflect the unsuccessful effort by the latch circuit 610 to latch the low logic level of the node n1.

The latch circuit 610 may be unable to latch the logic level at the node n1 for various reasons. For example, the power supply providing power to the circuits of the flip flop circuit 600, such as the latch circuit 610 and the latch circuit 620, may provide inadequate power (e.g., insufficient current drive) to correctly latch the logic level at node n1. As power continues to be provided to the circuits of the flip flop circuit 600, however, the power provided by the power supply may eventually increase to adequate levels so that the circuits operate properly. There may be other reasons for the circuits of the flip flop circuit 600 to not operate properly following power up, and the specific examples provided herein are not intended to limit the scope of the present disclosure. For example, in case a voltage potential of the power supply for the flip flop is insufficient to operate transistors constituting the flip flop, some pMOS transistors constituting the flip flop may not completely turn off and some nMOS transistors constituting the flip flop may not completely turn on. This situation may cause a current flowing in the flip flop to be insufficient. As a result, the flip flop may output an insufficient output value. For example, prior to the time T3, the level at the Node n1 cannot be lowered enough due to insufficient operation of the transistors. At the tune T3, because the voltage potential becomes high enough (see A in FIG. 7) to correctly operate the transistors, the Node n1 can be lowered enough.

At about time T3, the latch circuit 610 becomes operational and successfully latches a low logic level at the node n1 when the FF_DATA signal and the DETECTCK signal are at high logic levels. The latching of the low logic level at the node n1 by the latch circuit 610 and the activation of the inverter 622 by the high logic level of the DETECTCK signal (and the low logic level of the DETECTCKF signal) causes the RDY_DETECT signal to change to a high logic level at time T3.

The high logic level RDY_DETECT signal may be used to indicate that the flip flop circuit 600 is operational and as previously described, which may also be indicative of other flip flop circuits being operational. As also previously described, the RDY_DETECT signal is provided to the oscillator circuit. When the RDY_DETECT signal changes to the high logic level at time T3, the oscillator circuit is deactivated. As shown in FIG. 7, the deactivation of the oscillator circuit results in the FF_DATA signal and the DETECTCK signal (and DETECTCKF signal) no longer oscillating, and instead, having a constant low logic level.

As illustrated by FIG. 7, the flip flop circuit 600 may not operate properly to latch the FF_DATA signal although a supply voltage has exceeded a threshold voltage, as indicated by an active PWRUP signal. Operating various circuits as soon as the PWRUP signal becomes active may result in the circuits operating improperly. Using a model circuit as disclosed may provide a ready signal indicative of when circuits being modeled will operate properly following power up, thereby avoiding any errors resulting from improperly operating circuits, for example, due to providing inadequate power following power up.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
    an oscillator circuit configured to receive an activation signal and provide an oscillating signal based on the received activation signal;
    a timing circuit coupled to the oscillator circuit and configured to provide an oscillating data signal based at least in part on the oscillating signal; and
    a flip flop circuit coupled to the timing circuit and configured to latch a logic level of the oscillating data signal and provide an output signal to the oscillator circuit having a logic level based at least in part on the latched logic level.

2. The apparatus of claim 1, wherein the flip flop circuit is a model circuit configured to model other flip flop circuits.

3. The apparatus of claim 1, wherein at least one other flip flop circuit is enabled based on the output signal of the flip flop circuit.

4. The apparatus of claim 1, further comprising:
    a plurality of other flip flop circuits configured to be enabled,
    wherein the flip flop circuit is a model circuit; and
    wherein operation of the plurality of other flip flop circuits is responsive to operation of the model circuit.

5. The apparatus of claim 4, wherein the plurality of other flip flop circuits are configured to be enabled for operation responsive to a change in the logic level of the output signal of the model circuit.

6. The apparatus of claim 1, further comprising:
    a plurality of memory circuits,
    wherein the flip flop circuit is a model circuit, and
    wherein the plurality of memory circuits are configured to be reset responsive to a change in the logic level of the output signal of the model circuit.

7. The apparatus of claim 1, wherein the flip flop circuit includes:
    first and second latch circuits; and
    a reset circuit configured to reset the first and second latch circuits.

8. The apparatus of claim 1, wherein the timing circuit is configured to provide complementary clock signals based on the oscillating signal.

9. The apparatus of claim 8, wherein the flip flop circuit includes:
    first and second latch circuits,
    wherein the first latch circuit is configured to latch the logic level of the oscillating data signal responsive to the complementary clock signals and provide a first latch output signal, and
    wherein the second latch circuit is coupled to the first latch circuit and configured to latch a logic level of the first latch output signal responsive to the complementary clock signals and provide the output signal to the oscillator circuit.

10. The apparatus of claim 8, wherein a frequency of the oscillating data signal and a frequency of the complementary clock signals are the same.

11. A method, comprising:
    providing an active activation signal to a circuit during power up;
    generating and providing an output signal from the circuit based on the active activation signal; and
    ceasing operation of the circuit responsive to the output signal of the circuit becoming active.

12. The method of claim 11, wherein the active activation signal provided to continuously operate the circuit until the output signal of the circuit is active.

13. The method of claim 11, wherein the output signal provided from the circuit based on the active activation signal is an oscillating signal.

14. The method of claim 11, further comprising:

activating the circuit responsive to the active activation signal received by the circuit, wherein the output signal is provided by the activated circuit.

15. The method of claim 11, wherein the active activation signal is provided to continuously operate the circuit by clocking a flip flop circuit with a clock signal, the clock signal responsive to the output signal provided based on the active activation signal.

16. The method of claim 11, wherein the active activation signal is provided to continuously operate the circuit until the circuit properly latches a logic level of the output signal and provides the output signal having a same logic level as the latched output signal.

17. An apparatus, comprising:

a supply voltage detection circuit configured to receive a supply voltage and further configured to provide a power up signal responsive to the supply voltage; and a power supply ready circuit coupled to the first circuit, the second circuit configured to provide a ready detect signal that is active to a control circuit that enables a third circuit when the first signal is active.

18. The apparatus of claim 17, wherein the ready detect signal is active responsive to the power up signal being active, and wherein the power up signal is active responsive to the supply voltage exceeding a threshold voltage.

19. The apparatus of claim 17, wherein the power up signal provided by the supply voltage detection circuit is active based on a power up sequence for the supply voltage having been completed, and wherein the ready detect signal is active responsive to various circuits configured to be enabled by the power supply ready circuit being ready for operation.

* * * * *